(12) United States Patent
Tang et al.

(10) Patent No.: US 8,927,983 B2
(45) Date of Patent: Jan. 6, 2015

(54) THIN FILM TRANSISTOR SUBSTRATE AND METHOD FABRICATING THE SAME

(75) Inventors: Wen-Chung Tang, Hsinchu (TW); Fang-An Shu, Hsinchu (TW); Yao-Chou Tsai, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 6 days.

(21) Appl. No.: 13/589,172

(22) Filed: Aug. 19, 2012

(65) Prior Publication Data

US 2013/0105790 A1 May 2, 2013

Related U.S. Application Data

(60) Provisional application No. 61/552,021, filed on Oct. 27, 2011.

(30) Foreign Application Priority Data

Mar. 29, 2012 (TW) .............................. 101111145 A

(51) Int. Cl.
*H01L 29/10* (2006.01)
*H01L 29/12* (2006.01)
*H01L 21/02* (2006.01)
*H01L 21/00* (2006.01)
*H01L 27/12* (2006.01)

(52) U.S. Cl.
CPC .......... *H01L 27/124* (2013.01); *H01L 27/1259* (2013.01)

USPC ............. 257/43; 438/104; 438/149; 257/411; 257/639; 257/E21.413; 257/E21.414; 257/E21.078; 257/E21.267; 257/E27.111; 257/E29.137; 257/E29.151; 257/E29.068

(58) Field of Classification Search
USPC ............ 257/43, 411, 639, E21.413, E21.414, 257/E21.078, E21.267, E27.111, E29.137, 257/E29.151, E29.278, E29.068, E29.255; 438/104, 149

See application file for complete search history.

(56) References Cited

U.S. PATENT DOCUMENTS

| | | | |
|---|---|---|---|
| 2005/0170565 A1* | 8/2005 | Fujii et al. | 438/149 |
| 2007/0029626 A1* | 2/2007 | Sakama et al. | 257/411 |
| 2011/0175080 A1* | 7/2011 | Kim et al. | 257/43 |

* cited by examiner

*Primary Examiner* — Chuong A Luu
*Assistant Examiner* — Cory Eskridge
(74) *Attorney, Agent, or Firm* — CKC & Partners Co., Ltd.

(57) ABSTRACT

Disclosed herein is a thin film transistor array substrate. The thin film transistor array substrate includes a display area and a non-display area. The non-display area includes a signal line, a connecting line and a metal contact. The connecting line is formed in a first patterned metal layer. The signal line and the metal contact are formed in a second patterned metal layer. The connecting line is connected to the signal line by a first through-hole, and the connecting line is connected to the metal contact by a second through-hole. Furthermore, a method of fabricating the thin film transistor array substrate is also disclosed.

18 Claims, 13 Drawing Sheets

THIN FILM TRANSISTOR SUBSTRATE AND METHOD FABRICATING THE SAME

RELATED APPLICATIONS

This application claims priority to U.S. Provisional Application Ser. No. 61/552,021, filed Oct. 27, 2011, and Taiwan Application Serial Number 101111145, filed Mar. 29, 2012, the disclosures of which are incorporated herein by reference in their entireties.

BACKGROUND

1. Technical Field

The present disclosure relates to a circuit substrate. More particularly, the present disclosure relates to a thin film transistor array substrate.

2. Description of Related Art

In recent years, because a transistor made of metal oxide semiconductor has higher carrier mobility and thus better electrical performance and simpler manufacturing process than the conventional method, a metal-oxide-semiconductor thin film transistor (MOSTFT) with higher performance exhibits rapid developments and promising applications.

A thin film transistor (TFT) generally applies silicon nitride (SiNx) as a gate insulating layer and a passivation layer. Concerning the leakage problem of the components in the MOSTFT, it is a must using silicon oxide (SiOx) with a high film-forming temperature as material of the gate insulating layer, and using silicon oxynitride (SiOxNy) with low film-forming temperature as the passivation layer.

Since the passivation layer formed of SiOxNy has a looser structure causing pinhole defects, the surrounding moisture may possibly react with a signal line through the pinhole so as to make corrosion and electric disconnection in the circuit.

In view of foregoing, there exists a need of providing an improved method that sufficiently overcomes the above problem in the MOSTFT.

SUMMARY

The following presents a summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

An aspect of the present disclosure provides a thin film transistor (TFT) array substrate. The substrate comprises a display area and a non-display area, and the display area is surrounded by the non-display area. A thin film transistor (TFT), a scan line and a signal line are located in the display area, and the scan line, the signal line, a connecting line and a metal contact are located in the non-display area. The scan line disposed in a first patterned metal layer over the substrate is electrically connected to a gate electrode of the TFT. The signal line disposed in a second patterned metal layer over a gate insulating layer is electrically connected to a source electrode and a drain electrode of the TFT. The gate insulating layer covers at least a portion of the scan line and the connecting line in the first patterned metal layer. In the non-display area, the connecting line is electrically connected to the signal line located within the non-display area via a first through-hole of the gate insulating layer, and the metal contact is electrically connected to the connecting line via a second through-hole of the gate insulating layer.

According to one embodiment of the disclosure, the gate insulating layer is made of silicon oxide (SiOx) or silicon oxynitride (SiOxNy), and formed at a temperature in the range of 350° C. to 400° C.

According to another embodiment of the disclosure, the TFT at least comprises a metal oxide semiconductor (MOS), and the MOS is made of indium gallium zinc oxide (IGZO), indium gallium oxide (IGO), indium zinc oxide (IZO) or zinc oxide (ZnO).

According to one embodiment of the disclosure, the TFT further comprises a passivation layer covering the second patterned metal layer and the gate insulating layer. The passivation layer is made of SiOx or SiOxNy, and formed at a temperature in the range of 100° C. to 200° C.

According to another embodiment of the disclosure, the metal contact is made of a material same as that of the second patterned metal layer.

Another aspect of the present disclosure provides a method of preparing a thin film transistor (TFT) array substrate, and steps comprise the following. A substrate having a display area and a non-display area is provided, and the display area is surrounded by the non-display area. A first patterned metal layer having a gate electrode, a scan line and a connecting line is formed on the substrate. The gate electrode is formed within the display area, the scan line is formed within the display area and the non-display area, and the connecting line is formed within the non-display area. A gate insulating layer covering the first patterned metal layer within the non-display area has a first through-hole and a second through-hole for respectively exposing a portion of the connecting line. A patterned metal oxide semiconductor (MOS) layer is formed on the gate insulating layer, and corresponding to the gate electrode. A second patterned metal layer formed on the patterned MOS layer and the gate insulating layer has a source electrode, a drain electrode, a signal line and a metal contact. The signal line is electrically connected to the connecting line via the first through-hole, and the metal contact is electrically connected to the connecting line via the second through-hole. A passivation layer is formed on the second patterned metal layer and the gate insulating layer. The passivation layer of the display area has a contact window for exposing a portion of the drain electrode, and the passivation layer of the non-display area has an opening for exposing a portion of a contact pad. A pixel electrode formed on the passivation layer is electrically connected to the drain electrode by the contact window.

According to one embodiment of the disclosure, the material for forming the gate insulating layer comprises silane and nitrous oxide, and the film forming temperature of the gate insulating layer is in the range of 350° C. to 400° C., better still from 370° C. to 380° C.

According to other embodiment of the disclosure, the oxide semiconductor is made of indium gallium zinc oxide (IGZO), indium gallium oxide (IGO), indium zinc oxide (IZO) or zinc oxide (ZnO).

According to one embodiment of the disclosure, the material for forming the passivation layer comprises silane and nitrous oxide, and the film forming temperature of the passivation layer is in the range of 100° C. to 200° C., better still from 150° C. to 180° C.

Therefore, according to the embodiments which feature a connecting line in connection to a signal line and a contact pad, the generation of pinholes can be decreased to effectively prevent outside moisture from entering therein and thus causing the line corrosion.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
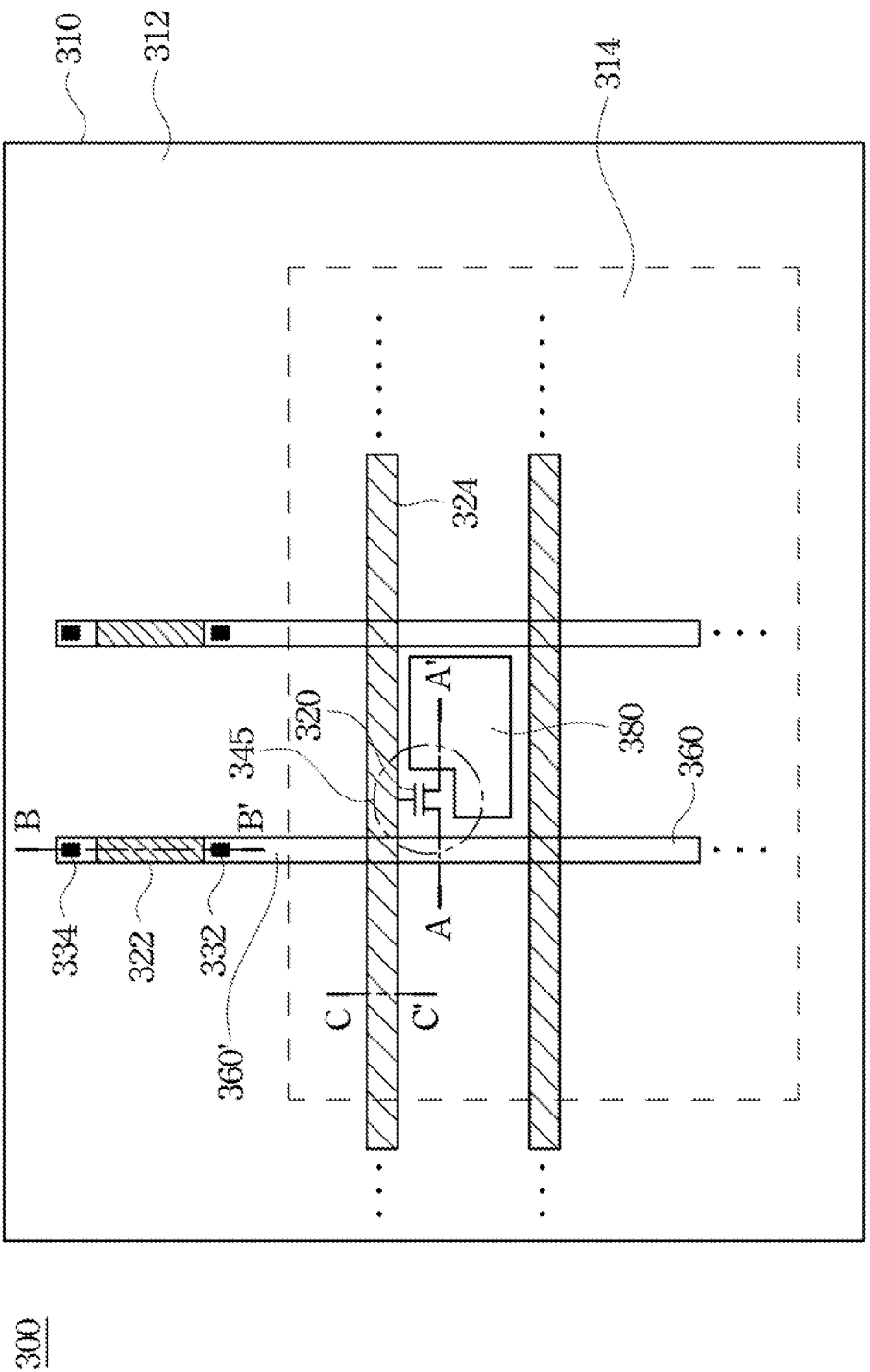
FIG. 1 is a top view illustrating a structure of a TFT array substrate according to one embodiment of this disclosure.

The disclosure is described by the following specific embodiments. Those with ordinary skill in the arts can readily understand the other advantages and functions of the present disclosure after reading the disclosure of this specification. The disclosure can also be implemented with different embodiments. Various details described in this specification can be modified based on different viewpoints and applications without departing from the scope of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 11:
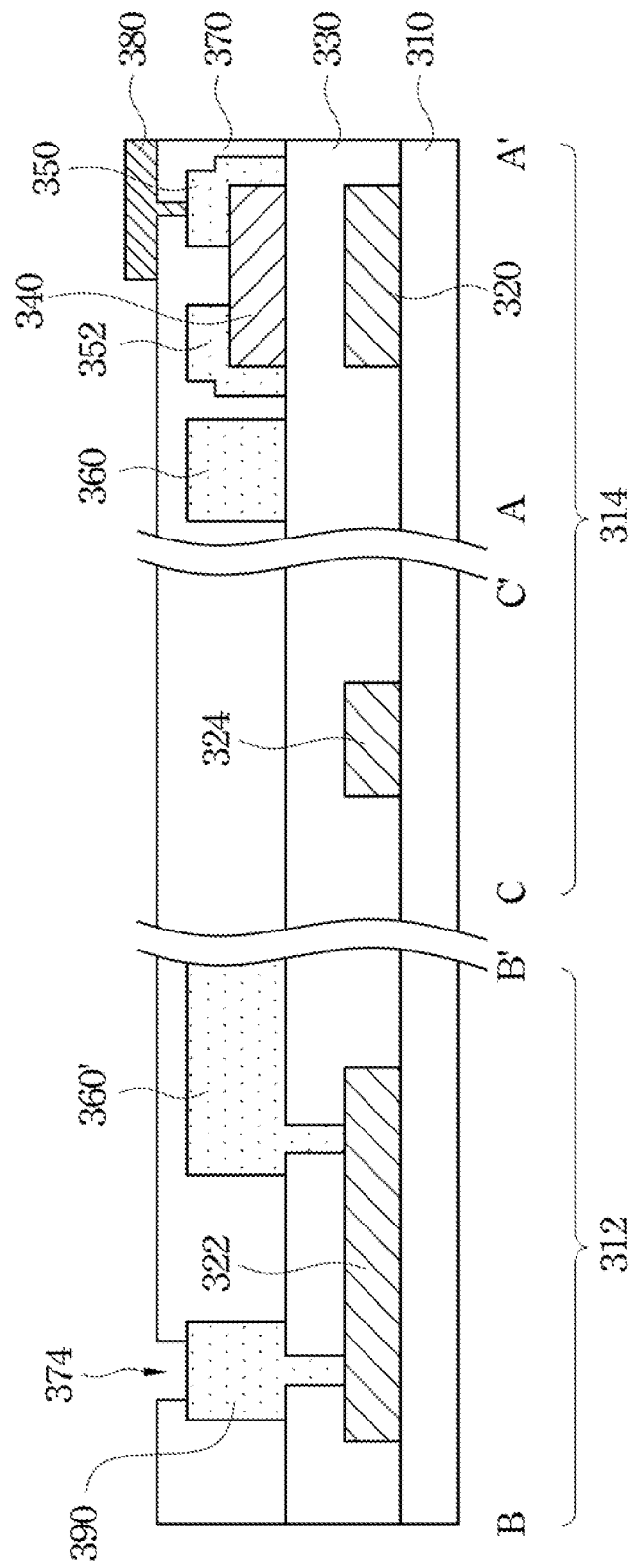

FIG. 1 is a top view illustrating a structure of a TFT array substrate 300 according to one embodiment of this disclosure. FIG. 11 is a cross-sectional view along the lines of A-A', B-B' and C-C' of FIG. 1. Reference is collectively made to FIG. 1 and FIG. 11.

The above-mentioned TFT array substrate 300 comprises at least a substrate 310, at least a scan line 324, at least a connecting line 322, at least a signal line 360, 360', at least a thin film transistor (TFT) 345 in an array arrangement and at least a pixel electrode 380. The substrate 310 comprises a display area 314 and a non-display area 312, and the display area 314 is surrounded by the non-display area 312. The scan line 324, the signal line 360, the TFT 345 and the pixel electrode 380 are located within the display area 314, and the TFT 345 and the pixel electrode 380 are located in the area crisscrossed by the scan line 324 and the signal line 360. The scan line 324, the signal line 360' and the connecting line 322 are located within the non-display area 312.

A first patterned metal layer is disposed on the substrate 310 for forming a gate electrode 320, the scan line 324 and the connecting line 322. The scan line 324 is electrically connected to the gate electrode 320 of the TFT 345. A gate insulating layer 330 disposed on the first patterned metal layer covers the gate electrode 320, the scan line 324 and the connecting line 322. In the non-display area 312, the gate insulating layer 330 has a first through-hole 332 and a second through-hole 334 for respectively exposing the connecting line 322 disposed in the first patterned metal layer. A second patterned metal layer disposed on the gate insulating layer 330 for forming a source electrode 352, a drain electrode 350 and the connecting line 322. The signal line 360 is electrically connected to the source electrode 352 and the drain electrode 350 of the TFT 345. As shown in FIG. 1 and FIG. 11, the connecting line 322 is electrically connected to the signal line 360' via the first through-hole 332, and a metal contact 390 is electrically connected to the connecting line 322 via the second through-hole 334 disposed in the gate insulating layer 330.

Figure 2:
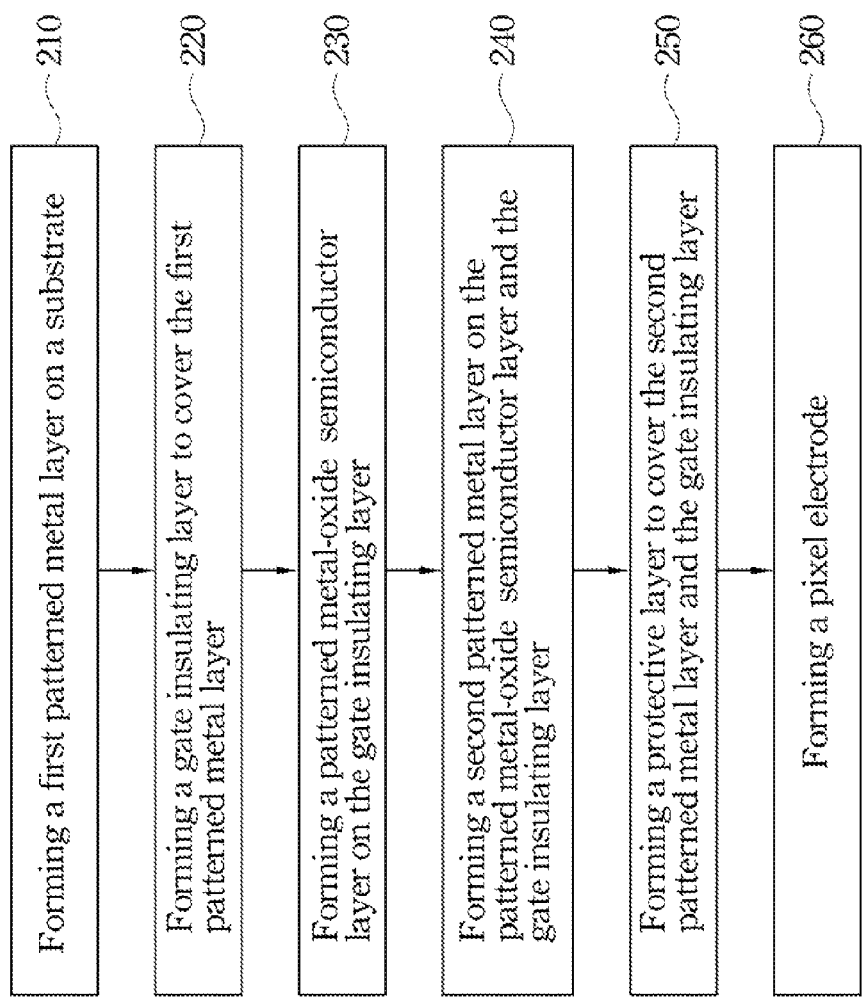
FIG. 2 is a flow chart illustrating process steps for manufacturing a TFT array substrate according to one embodiment of this disclosure.

FIG. 2 is a flow chart illustrating process steps for manufacturing a thin film transistor (TFT) array substrate 300 according to one embodiment of this disclosure, and FIG. 3 to FIG. 8 are cross-sectional views schematically illustrating process steps of the method in sequence.

Figure 3:
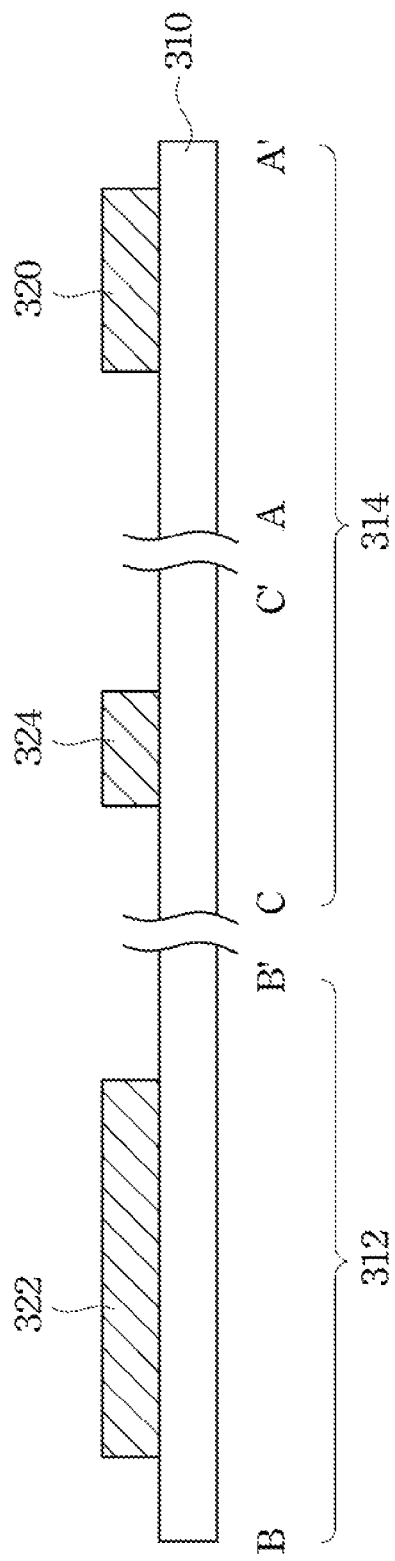
FIG. 3-11 are cross-sectional views along the lines of A-A', B-B' and C-C' of FIG. 1 schematically illustrating process steps for manufacturing a TFT array substrate according to one embodiment of this disclosure.

In step 210, a first patterned metal layer is formed on a substrate 310, as shown in FIG. 3. With reference to FIG. 1, the substrate 310 comprises a display area 314 and a non-display area 312, and the display area 314 is surrounded by the non-display area 312. According to one embodiment of this disclosure, the substrate 310 is made of glass, quartz, plastics or other polymer materials.

The first patterned metal layer can be formed by any known method. In one embodiment, the whole first patterned metal layer deposited on the substrate 310 has a gate electrode 320, a scan line 324 and a connecting line 322 patterned by a photolithography etching process. The gate electrode 320 is formed within the display area 314, the scan line 324 is formed within the display area 314 and the non-display area, and the connecting line 322 is formed within the non-display area 312 with reference to FIG. 1.

The first patterned metal layer can be a single layer or a multiple layer. In one embodiment, the first patterned metal layer is made of tungsten (Wu), chromium (Cr), copper (Cu), molybdenum (Mo), aluminum (Al), neodymium (Nd), titanium (Ti) or a combination or alloy thereof.

Figure 4:
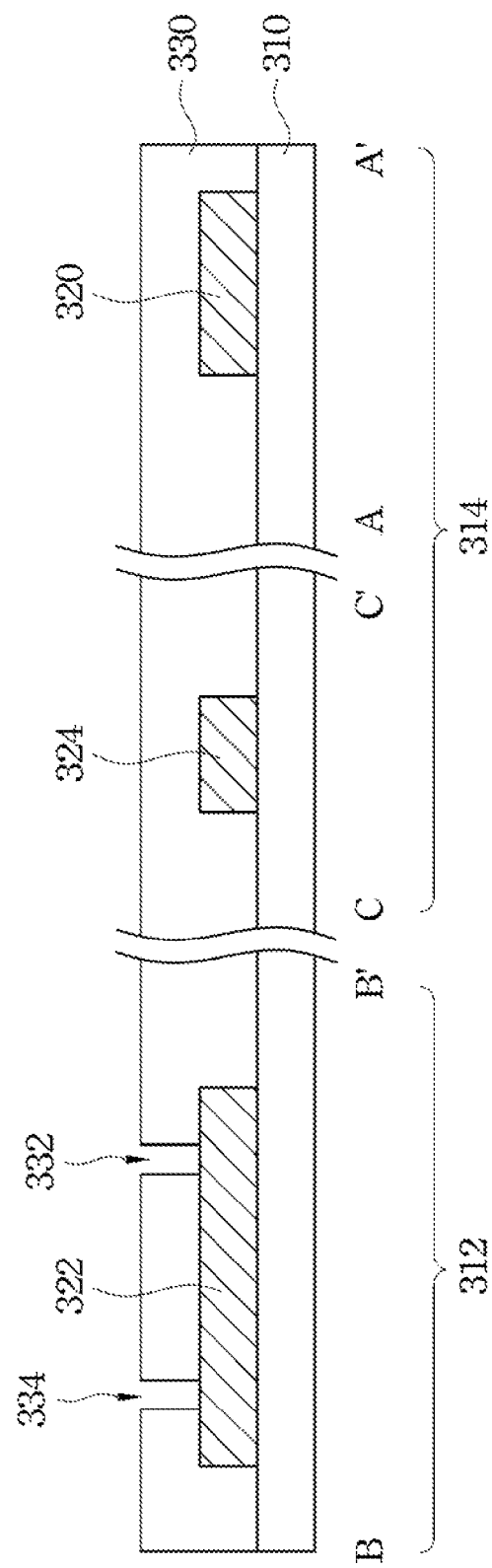

In step 220, a gate insulating layer 330 is formed to cover the first patterned metal layer, as shown in FIG. 4. In the non-display area 312, the gate insulating layer 330 has a first through-hole 332 and a second through-hole 334 for exposing a portion of the connecting line 322 as a contact pad.

In one embodiment, the gate insulating layer 330 is formed by plasma-enhanced chemical vapor deposition (PECVD). Reaction gases, such as silane and nitrous nitride, are sent to a reaction chamber to produce a chemical reaction and form silicon oxide (SiOx) or silicon oxynitride (SiOxNy) for deposition of the gate insulating layer 330. In this embodiment, the gate insulating layer 330 is formed at a temperature in the range of 350° C. to 400° C., preferably from 360° C. to 390° C., better still from 370° C. to 380° C.

Figure 5:
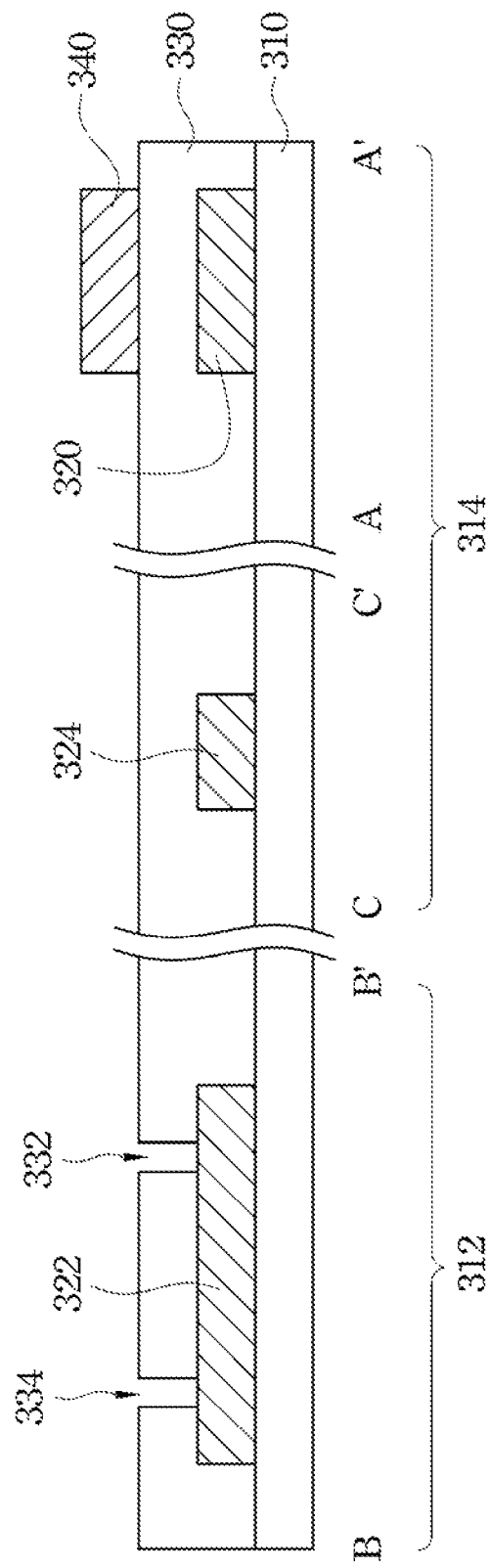

In step 230, a patterned metal oxide semiconductor (MOS) layer 340 is formed on the gate insulating layer 330, as shown in FIG. 5, the patterned MOS layer 340 is corresponding to the gate electrode 320.

The patterned MOS layer 340 can be formed by any known method. In one embodiment, the method for forming the patterned MOS layer 340 is RF magnetron sputtering or DC sputtering. The patterned MOS layer 340 is made of indium gallium zinc oxide (IGZO), indium gallium oxide (IGO), indium zinc oxide (IZO), zinc oxide (ZnO) or the likes.

Figure 6:
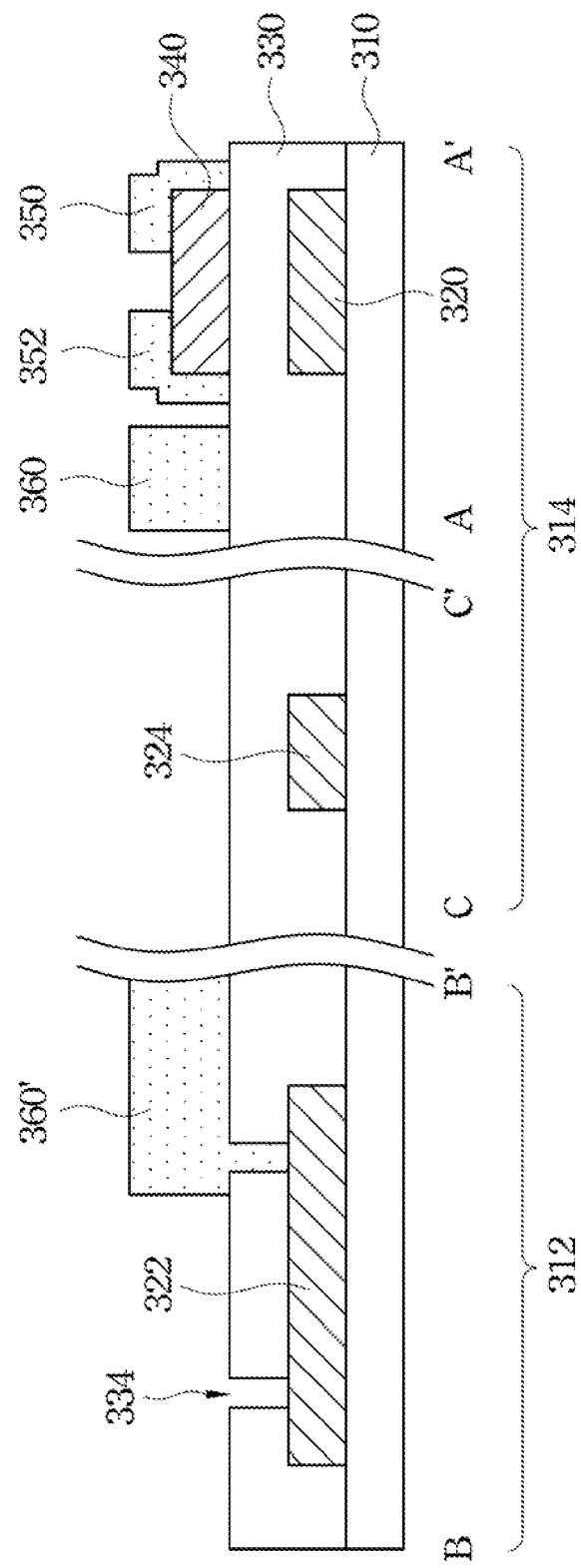

In step 240, a second patterned metal layer having a source electrode 352, a drain electrode 350 and a signal line 360, 360' is formed on the patterned MOS layer 340 and the gate insulating layer 330, as shown in FIG. 6. The signal line 360' of the second patterned metal layer is electrically connected to the connecting line 322 of the first patterned metal layer via the first through-hole 332.

In one embodiment, the whole second metal layer deposited on the gate insulating layer 330 has the source electrode 352, the drain electrode 350 and the signal line 360, 360' formed by a photolithography etching process within the display area 314 and non-display area 312.

The material of the second patterned metal layer is the same as or different from that of the first patterned metal layer. The second patterned metal layer is made of tungsten (Wu), chromium (Cr), copper (Cu), molybdenum (Mo), aluminum (Al), neodymium (Nd), titanium (Ti), or a combination or alloy thereof.

Figure 7A:
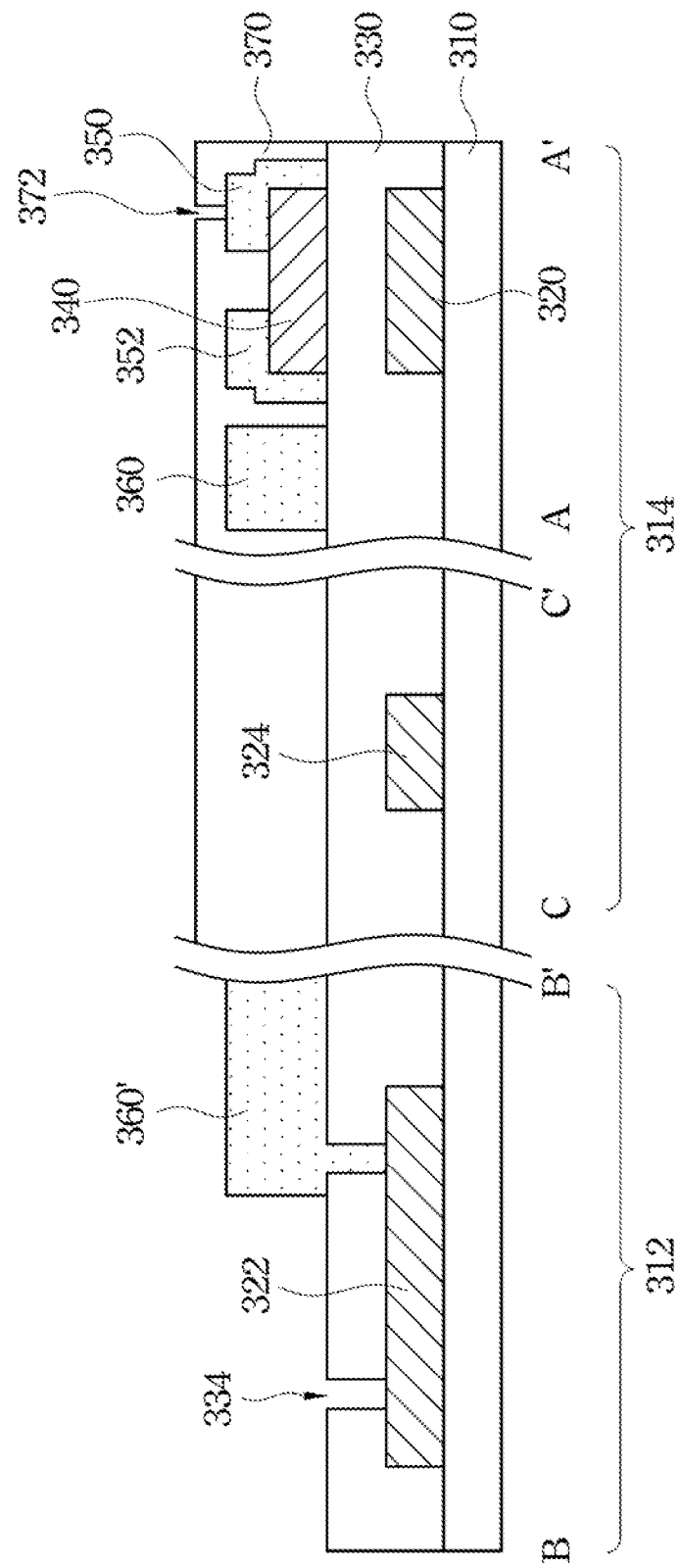
Figure 7B:
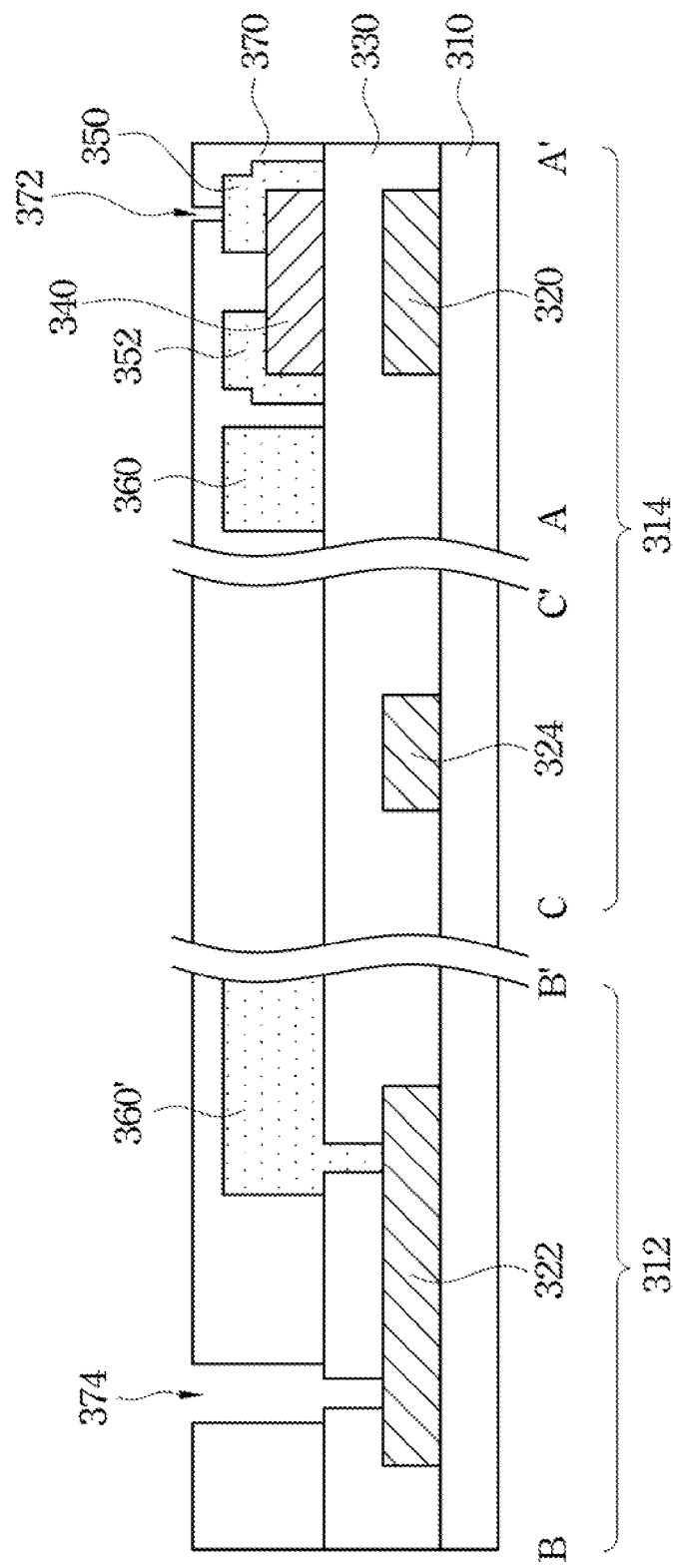

In step 250, a passivation layer 370 is formed on the second patterned metal layer and the gate insulating layer 330. In one embodiment, the passivation layer 370, formed on the source electrode 352, the drain electrode 350, the signal line 360 and the gate insulating layer 330 of the second patterned metal layer within the display area 314, has a contact window 372 for exposing a portion of the drain electrode 350, as shown in FIG. 7A. In another embodiment, the passivation layer 370 covers the source electrode 352, the drain electrode 350, the signal line 360, 360' and the gate insulating layer 330 of the second patterned metal layer. In the display area 314, the passivation layer 370 has a contact window 372 for exposing a portion of the drain electrode 350, and in the non-display area 312 the passivation layer 370 has an opening 374 for exposing a portion of the connecting line 322 as a contact pad, as shown in FIG. 7B.

In one embodiment, the passivation layer 370 is formed by plasma-enhanced chemical vapor deposition. Reaction gases, such as silane and nitrous nitride, are sent to a reaction chamber to produce a chemical reaction and form silicon oxide (SiOx) or silicon oxynitride (SiOxNy) for deposition of the passivation layer 370. The passivation layer 330 is formed at a temperature in the range of 100° C. to 200° C., preferably from 150° C. to 180° C., better still from 160° C. to 170° C.

Figure 8:
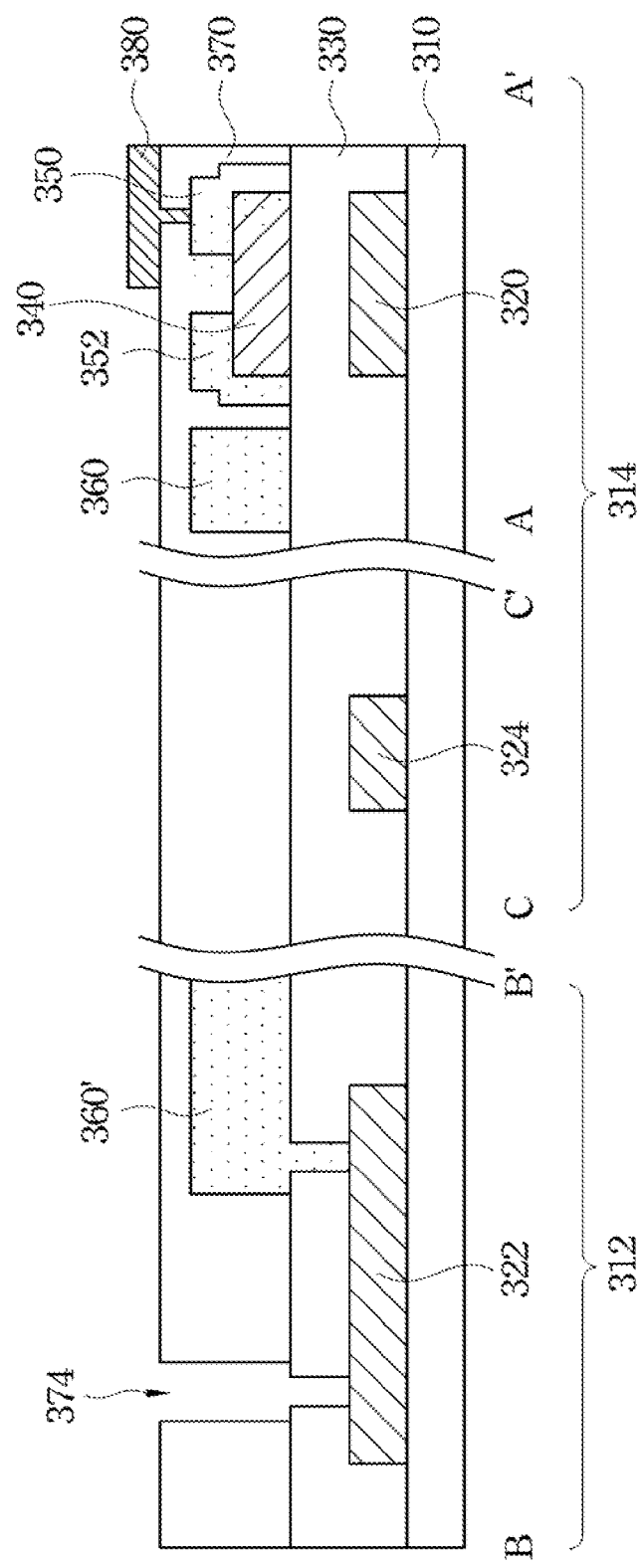

In step 260, a pixel electrode 380 formed on the passivation layer 370 is electrically connected to the drain electrode 350 by the contact window 372, as shown in FIG. 8.

Figure 9:
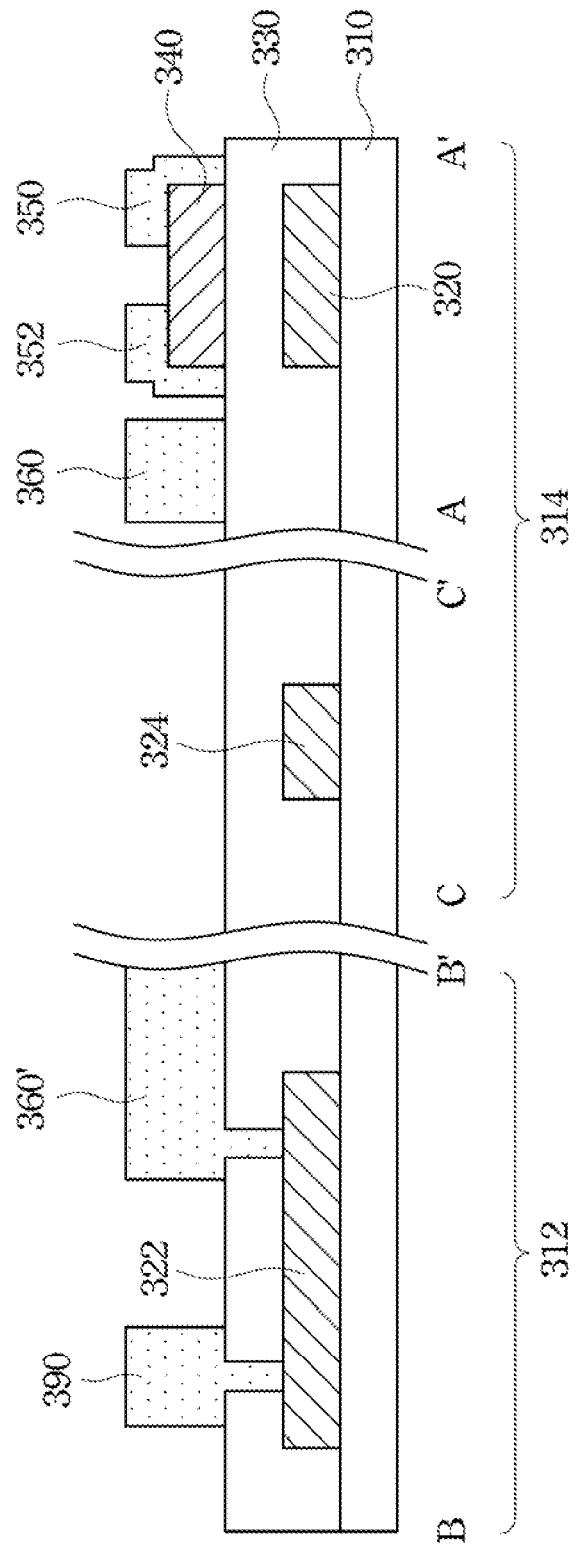

In another embodiment, steps from 210 to 230 are the same as the above-mentioned embodiment. In step 240, the second patterned metal layer is formed on the patterned MOS layer 340 and the gate insulating layer 330, as shown in FIG. 9, the second patterned metal layer has the source electrode 352, the drain electrode 350, the signal line 360, 360' and the metal contact 390. The metal contact 390 is electrically connected to the connecting line 322 of the first patterned metal layer via the second through-hole 334, and the signal line 360' is electrically connected to the connecting line 322 of the first patterned metal layer via the first through-hole 332.

Figure 10A:
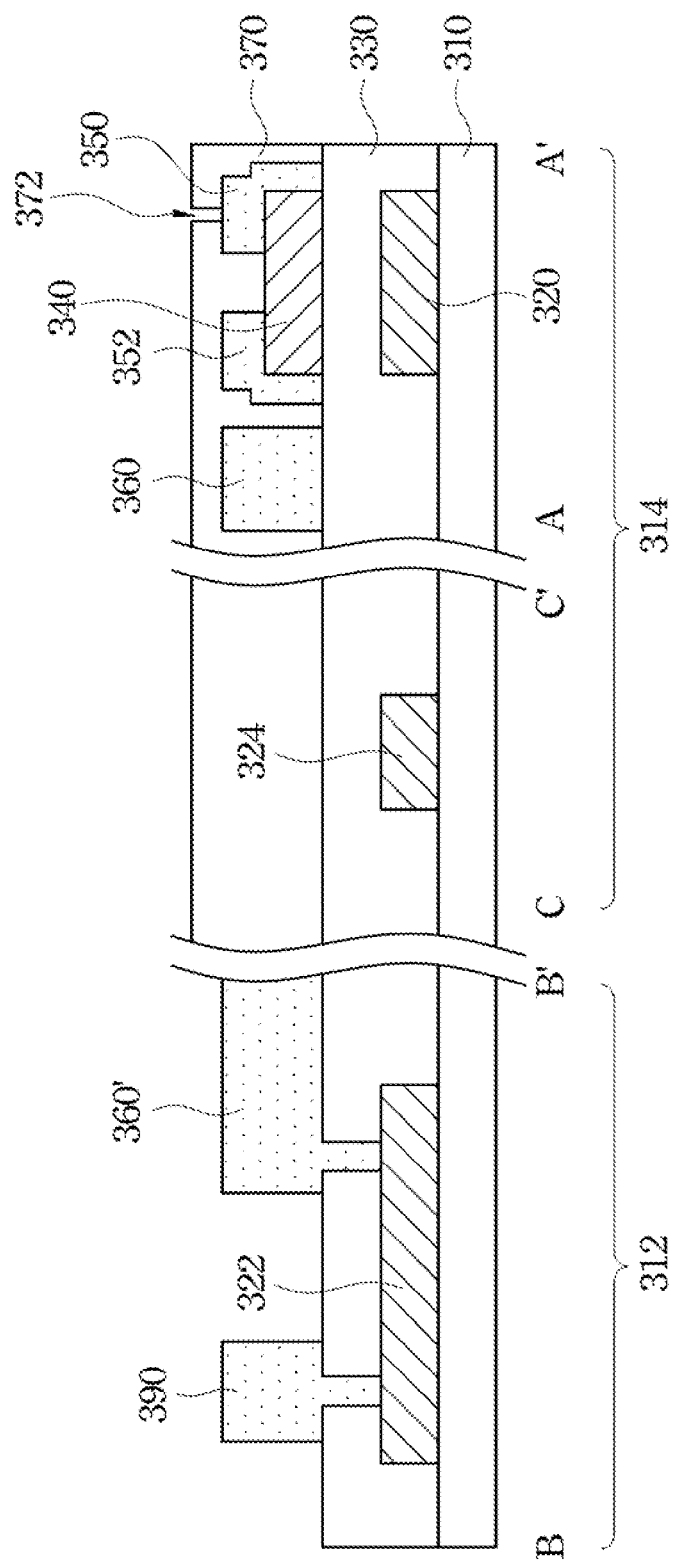
Figure 10B:
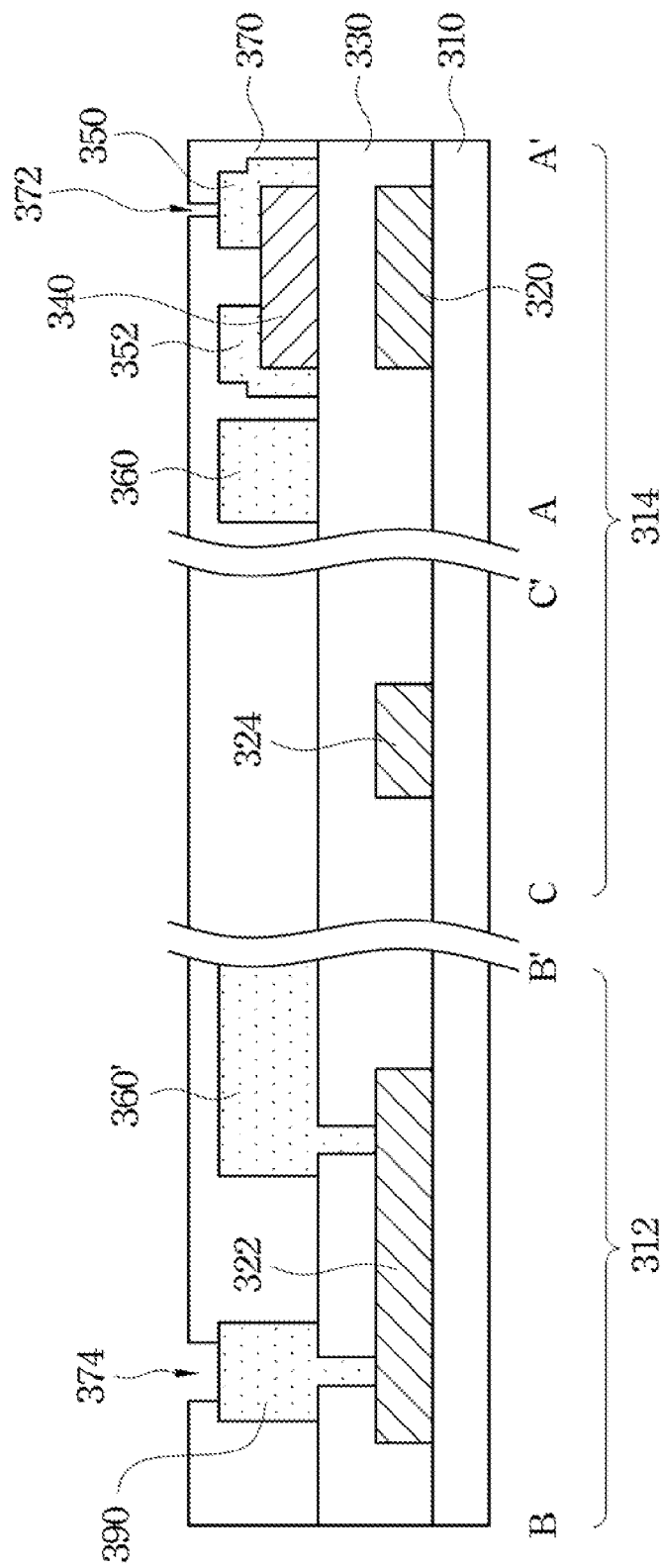

In step 250, the passivation layer 370 is formed on the second patterned metal layer and the gate insulating layer 330. In one embodiment, the passivation layer 370 is formed on the source electrode 352, the drain electrode 350, the signal line 360 and the gate insulating layer 330 of the second patterned metal layer within the display area 314, and the passivation layer 370 has a contact window 372 for exposing a portion of the drain electrode 350, as shown in FIG. 10A. In another embodiment, the passivation layer 370 covers the source electrode 352, the drain electrode 350, the signal line 360, 360' the gate insulating layer 330 and the metal contact 390 of the second patterned metal layer. In the display area 314, the passivation layer 370 has a contact window 372 for exposing a portion of the drain electrode 350, and in the non-display area 312 the passivation layer 370 has an opening 374 for exposing a portion of the metal contact 390 as a contact pad, as shown in FIG. 10B.

In step 260, the pixel electrode 380 formed on the passivation layer 370 is electrically connected to the drain electrode 350 by the contact window 372, as shown in FIG. 11. In this embodiment, the specification and the features of the second patterned metal layer, the passivation layer 370 and the pixel electrode 380 can be the same as the above-mentioned embodiment.

Conventionally, the lines within the non-display area are covered only by a single passivation layer, which is formed at a low temperature in the range of 150° C. to 200° C. The property of low film-forming temperature makes the structure of the passivation layer looser and thus with pinhole defects. According the embodiment of this disclosure, lines within the non-display area con be covered a single layer formed by a gate insulating layer or a bilayer formed by a gate insulating layer and a passivation layer. Comparing to the passivation layer formed at a low temperature, the gate insulating layer formed at a higher temperature in the range of 350° C. to 400° C. has a much more to compact structure. As such, the compact structure can prevent the TFT array substrate from damage of surrounding moisture or air, so as to furthermore reduce the possibility of the RF failure.

It will be apparent to those ordinarily skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A thin film transistor array substrate, comprising:
   a substrate comprising a display area and a non-display area, wherein the display area is surrounded by the non-display area;
   a thin film transistor located in the display area of the substrate;
   a first patterned metal layer disposed on the substrate, comprising:
   a gate electrode of the thin film transistor;
   a scan line electrically connected to the gate electrode, wherein the scan line is located in the display area and the non-display area; and
   a connecting line located in the non-display area; and
   a second patterned metal layer disposed on a gate insulating layer, comprising:
   a metal contact, a source electrode, and a drain electrode of the thin film transistor; and
   a signal line electrically connected to the source electrode and the drain electrode, all formed from the same patterned metal layer, wherein the signal line is located in the display area and the non-display area,
   wherein the gate insulating layer covers at least a portion of the scan line and the connecting line, the connecting line is in contact with the signal line at the non-display area via a first through-hole of the gate insulating layer, and the metal contact is in contact with the connecting line via a second through-hole of the gate insulating layer at the non-display area.

2. The thin film transistor array substrate of claim 1, wherein the gate insulating layer is made of silicon oxide (SiOx) or silicon oxynitride (SiOxNy).

3. The thin film transistor array substrate of claim 1, wherein the gate insulating layer is formed at a temperature in the range of 350° C. to 400° C.

4. The thin film transistor array substrate of claim 1, wherein the thin film transistor further comprises a metal oxide semiconductor.

5. The thin film transistor array substrate of claim 4, wherein the metal oxide semiconductor is made of indium gallium zinc oxide (IGZO), indium gallium, oxide (IGO), indium zinc oxide (IZO) or zinc oxide (ZnO).

6. The thin film transistor array substrate of claim 1, further comprising a passivation layer covering the second patterned metal layer and the gate insulating layer.

7. The thin film transistor array substrate of claim 6, wherein the passivation layer is made of silicon oxide (SiOx) or silicon oxynitride (SiOxNy).

8. The thin film transistor array substrate of claim 6, wherein the passivation layer is formed at a temperature in the range of 100° C. to 200° C.

9. The thin film transistor array substrate of claim 1, wherein the metal contact is made of a material same as that of the second patterned metal layer.

10. A method of preparing a thin film transistor array substrate, comprising the steps of:
  providing a substrate having a display area and a non-display area, wherein the display area is surrounded by the non-display area;
  forming a first patterned metal layer on the substrate, the first patterned metal layer having a gate electrode, a scan line and a connecting line, wherein the gate electrode is formed within the display area, the scan line is formed within the display area and the non-display area, and the connecting line is formed within the non-display area;
  forming a gate insulating layer covering the first patterned metal layer, wherein the gate insulating layer within the non-display area has a first through-hole and a second through-hole for respectively exposing a portion of the connecting line in the first patterned metal layer;
  forming a patterned metal oxide semiconductor layer on the gate insulating layer, wherein the patterned metal oxide semiconductor layer is corresponding to the gate electrode;
  forming a second patterned metal layer on the patterned metal oxide semiconductor layer and the gate insulating layer, the second patterned metal layer having a source electrode, a drain electrode, a signal line, and a metal contact, wherein the signal line of the second patterned metal layer is in contact with the connecting line of the first patterned metal layer by the first through-hole, and the metal contact of the second patterned metal layer is in contact with the connecting line of the first patterned metal layer by the second through-hole;
  forming a passivation layer on the second patterned metal layer and the gate insulating layer within the display area, wherein the passivation has a contact window for exposing a portion of the drain electrode; and
  forming a pixel electrode on the passivation layer, wherein the pixel electrode is electrically connected to the drain electrode by the contact window.

11. The preparing method of the claim 10, wherein the material for forming the gate insulating layer comprises silane and nitrous oxide.

12. The preparing method of the claim 10, wherein the gate insulating layer is formed at a temperature in the range of 350° C. to 400° C.

13. The preparing method of the claim 10, wherein the gate insulating layer is formed at a temperature in the range of 370° C. to 380° C.

14. The preparing method of the claim 10, wherein the metal oxide semiconductor is made of indium gallium zinc oxide (IGZO), indium gallium oxide (IGO), indium zinc oxide (IZO) or zinc oxide (ZnO).

15. The preparing method of the claim 10, wherein forming the passivation layer further comprises a step of covering the second patterned metal layer and the gate insulating layer in the non-display area, wherein the passivation layer has an opening for exposing a portion of the contact pad.

16. The preparing method of the claim 10, wherein the material for forming the passivation layer comprises silane and nitrous oxide.

17. The preparing method of the claim 10, wherein the passivation layer is formed at a temperature in the range of 100° C. to 200° C.

18. The preparing method of the claim 10, wherein the passivation layer is formed at a temperature in the range of 150° C. to 180° C.

* * * * *